US012294362B2

(12) United States Patent
Lee et al.

(10) Patent No.: US 12,294,362 B2
(45) Date of Patent: *May 6, 2025

(54) ANALOG INPUT DEVICE, COMPUTING SYSTEM AND METHOD FOR RECEIVING AND PROCESSING ANALOG INPUT

(71) Applicant: Razer (Asia-Pacific) Pte. Ltd., Singapore (SG)

(72) Inventors: Chung Wei Lee, Singapore (SG); Thuan Teck Tan, Singapore (SG); Wenliang Yang, Singapore (SG); Alvin Sim, Singapore (SG); Kok Kiong Low, Singapore (SG)

(73) Assignee: Razer (Asia-Pacific) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/379,514

(22) Filed: Oct. 12, 2023

(65) Prior Publication Data

US 2024/0056076 A1 Feb. 15, 2024

Related U.S. Application Data

(63) Continuation of application No. 17/297,445, filed as application No. PCT/SG2019/050512 on Oct. 17, 2019, now Pat. No. 11,863,175.

(Continued)

(51) Int. Cl.
*H03K 17/969* (2006.01)
*G01L 1/24* (2006.01)
(Continued)

(52) U.S. Cl.
CPC .............. *H03K 17/969* (2013.01); *G01L 1/24* (2013.01); *G06F 3/0202* (2013.01);
(Continued)

(58) Field of Classification Search
CPC ...... H03K 17/969; H03K 17/968; G01L 1/24; G01L 17/00; G06F 3/0202; G06F 3/023;
(Continued)

(56) References Cited

U.S. PATENT DOCUMENTS 5,675,329 A 10/1997 Barker et al.
8,411,029 B2 4/2013 Casparian et al.
(Continued)

FOREIGN PATENT DOCUMENTS

CN 201667666 U 12/2010
CN 102843143 A 12/2012
(Continued)

OTHER PUBLICATIONS

Wooting two—lekker edition (https://wooting.io/wooting_two_lekker), Sep. 4, 2019 in 13 pages.
(Continued)

*Primary Examiner* — Amit Chatly
(74) *Attorney, Agent, or Firm* — Polsinelli PC

(57) ABSTRACT

An analog input device including at least one mounting panel and a matrix of analog push button assemblies mounted thereon. Each analog push button assembly including an analog pressure sensor including a pressure reception arrangement having an optical sensing sub-arrangement configured to measure an amount of light varied according to a pressure sensed at the pressure reception arrangement and an output terminal for outputting an analog signal corresponding to the amount of light measured, and a plunger element configured to exert the pressure on the pressure reception arrangement. The analog input device may include a multiplexer including an input side coupled to the push button assemblies and an output side; an analog-to-digital converter coupled to the output side of the multiplexer; a processor coupled to the analog-to-digital con-
(Continued)

verter and configured to output a data packet; and a communication interface configured to transmit the data packet to a host computing device.

20 Claims, 6 Drawing Sheets

Related U.S. Application Data

(60) Provisional application No. 62/779,006, filed on Dec. 13, 2018.

(51) Int. Cl.
    *G06F 3/02*     (2006.01)
    *H01H 13/14*     (2006.01)
    *H01H 13/83*     (2006.01)

(52) U.S. Cl.
    CPC ............ *H01H 13/14* (2013.01); *H01H 13/83* (2013.01); *H01H 2231/002* (2013.01); *H01H 2239/022* (2013.01)

(58) Field of Classification Search
    CPC ...... G06F 3/0304; G06F 3/0362; G06F 3/038; H01H 13/14; H01H 13/83; H01H 2231/002; H01H 2239/022
    See application file for complete search history.

(56) References Cited

U.S. PATENT DOCUMENTS

| | | | | |
|---|---|---|---|---|
| 8,648,737 | B1 * | 2/2014 | Bowen | G06F 3/0202 |
| | | | | 345/169 |
| 8,648,812 | B2 | 2/2014 | Aull et al. | |
| 8,700,829 | B2 | 4/2014 | Casparian et al. | |
| 8,711,011 | B2 | 4/2014 | Casparian et al. | |
| 8,717,202 | B1 | 5/2014 | Bajaj et al. | |
| 8,922,399 | B2 | 12/2014 | Bajaj et al. | |
| 9,246,487 | B2 | 1/2016 | Casparian et al. | |
| 9,389,711 | B2 | 7/2016 | Casparian et al. | |
| 9,634,661 | B1 * | 4/2017 | Chen | H03K 17/969 |
| 9,857,892 | B2 | 1/2018 | Armstrong-Muntner | |
| 9,952,682 | B2 * | 4/2018 | Zhang | G06F 1/1662 |
| 11,463,091 | B2 * | 10/2022 | Lee | G01L 1/24 |
| 11,863,175 | B2 * | 1/2024 | Lee | G06F 3/0202 |
| 2008/0042978 | A1 * | 2/2008 | Perez-Noguera | G06F 3/0202 |
| | | | | 345/168 |
| 2013/0291090 | A1 | 10/2013 | Toebes et al. | |
| 2014/0267053 | A1 * | 9/2014 | Bajaj | G06F 3/0202 |
| | | | | 345/168 |
| 2015/0061901 | A1 * | 3/2015 | Casparian | H01H 13/705 |
| | | | | 341/22 |
| 2015/0153847 | A1 | 6/2015 | Irani et al. | |
| 2015/0206672 | A1 * | 7/2015 | Hsu | G06F 3/0202 |
| | | | | 307/115 |
| 2017/0169967 | A1 * | 6/2017 | Chen | H03K 17/968 |
| 2017/0346488 | A1 * | 11/2017 | Minezaki | G06F 3/0202 |
| 2017/0364259 | A1 | 12/2017 | Kamata et al. | |
| 2018/0203521 | A1 * | 7/2018 | Wackers | G06F 3/0202 |
| 2021/0126634 | A1 * | 4/2021 | Lee | G01L 17/00 |

FOREIGN PATENT DOCUMENTS

| | | |
|---|---|---|
| CN | 105074627 A | 11/2015 |
| CN | 205049922 U | 2/2016 |
| CN | 105843418 A | 8/2016 |
| DE | 102007022358 A1 | 11/2008 |
| JP | 3377114 B2 | 2/2003 |
| KR | 2007-0022586 | 2/2007 |
| WO | 20199075933 A1 | 4/2019 |

OTHER PUBLICATIONS

ST, AN 979 Application Note, "Driving an Analog Keyboard With the ST7 ADC", by Microcontroller Divisional Applications, (https://www.st.com/content/ccc/resource/technical/document/application_note/00/09/79/3a/ac/59/4b/8e/CD00004024.pdf/files/CD00004024.pdf/jcr:content/translations/en.CD00004024.pdf), 2003 in 14 pages.
Extended European Search Report mailed Jan. 14, 2022 in 11 pages, for the corresponding European Patent Application No. 19896442.1.
Chinese first office action; Dated Dec. 22, 2023; Application #201980081438.8.

* cited by examiner

ANALOG INPUT DEVICE, COMPUTING SYSTEM AND METHOD FOR RECEIVING AND PROCESSING ANALOG INPUT

CROSS-REFERENCE TO RELATED APPLICATIONS

The present application is a continuation of U.S. patent application Ser. No. 17/297,445 filed May 26, 2021, which is a U.S. National Phase of International Application No. PCT/SG2019/050512 filed Oct. 17, 2019, which in turn claims the benefit of the U.S. provisional patent application No. 62/779,006 filed on 13 Dec. 2018, the entire contents of which are incorporated herein by reference for all purposes.

TECHNICAL FIELD

Various embodiments generally relate to an analog input device, a computing system for receiving and processing analog input and a method of processing analog input for a computer system. In particular, various embodiments generally relate to a force-sensitive or pressure sensitive analog input device.

BACKGROUND

Conventionally, input devices such as gaming controller, gaming keypad, keyboard, or mice includes buttons or keys which are coupled to digital switches. These digital switches only output binary signal, and limits the achievable functions of the input devices and possible user intents. For example, in gaming, more granularity of the input may be preferred for more precise control of a magnitude for a character's speed, directions, movements, actions etc. Such controls are typically not achievable with binary input devices.

Accordingly, there is a need for a more effective input device to address the above issues.

SUMMARY

According to various embodiments, there is provided an analog input device. The analog input device may include at least one mounting panel. The analog input device may include a matrix of analog push button assemblies mounted to the at least one mounting panel, each analog push button assembly including an analog pressure sensor. The analog pressure sensor of the analog input device may include a pressure reception arrangement having an optical sensing sub-arrangement configured to measure an amount of light varied according to a pressure sensed at the pressure reception arrangement and an output terminal for outputting an analog signal corresponding to the amount of light measured. The analog pressure sensor of the analog input device may include a plunger element configured to exert the pressure on the pressure reception arrangement when the analog push button assembly is pressed by a user's finger. The analog input device may further include a multiplexer including an input side and an output side, wherein the input side is coupled to the output terminals of the matrix of analog push button assemblies. The analog input device may further include an analog-to-digital converter which is coupled to the output side of the multiplexer. The analog input device may further include a processor which is coupled to the analog-to-digital converter and which is configured to output a data packet including a button identity (ID) of the push button assembly pressed by the user's finger and a digital-step-value corresponding to the analog signal from the push button assembly. The analog input device may further include a communication interface configured to transmit the data packet to a host computing device.

According to various embodiments, there is provided a computing system for receiving and processing analog input. The computing system may include a host processor. The computing system may include the input device, as described herein, connected to the host processor via the communication interface. The host processor may be configured to receive the data packet from the input device, to determine an amount of depression of a respective push button assembly based on the digital-step-value corresponding to the analog signal from the push button assembly, and to generate a corresponding predetermined application event in an application based on the determined amount of depression of the respective push button assembly and an input setting for the application.

According to various embodiments, there is provided a method of processing analog input for a computing system as described herein. The method may include generating, via the pressure reception arrangement, the analog signal corresponding to the amount of light measured as a measure of the pressure exerted on the pressure reception arrangement when the push button assembly is pressed by a user's finger. The method may include digitizing, via the analog-to-digital converter, the analog signal into the corresponding digital-step-value. The method may include outputting, via the processor, the data packet including button identity (ID) of the push button assembly pressed by the user's finger and a digital-step-value corresponding to the analog signal from the push button assembly. The method may include transmitting, via the communication interface, the data packet from the processor of the input device to the host processor of the computing system. The method may include determining, via the host processor, the amount of depression of the respective push button assembly based on the corresponding digital-step-value from the data packet received. The method may include generating, via the host processor, the corresponding predetermined application event in the application based on the determined amount of depression of the respective push button assembly and the input setting for the application.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1:
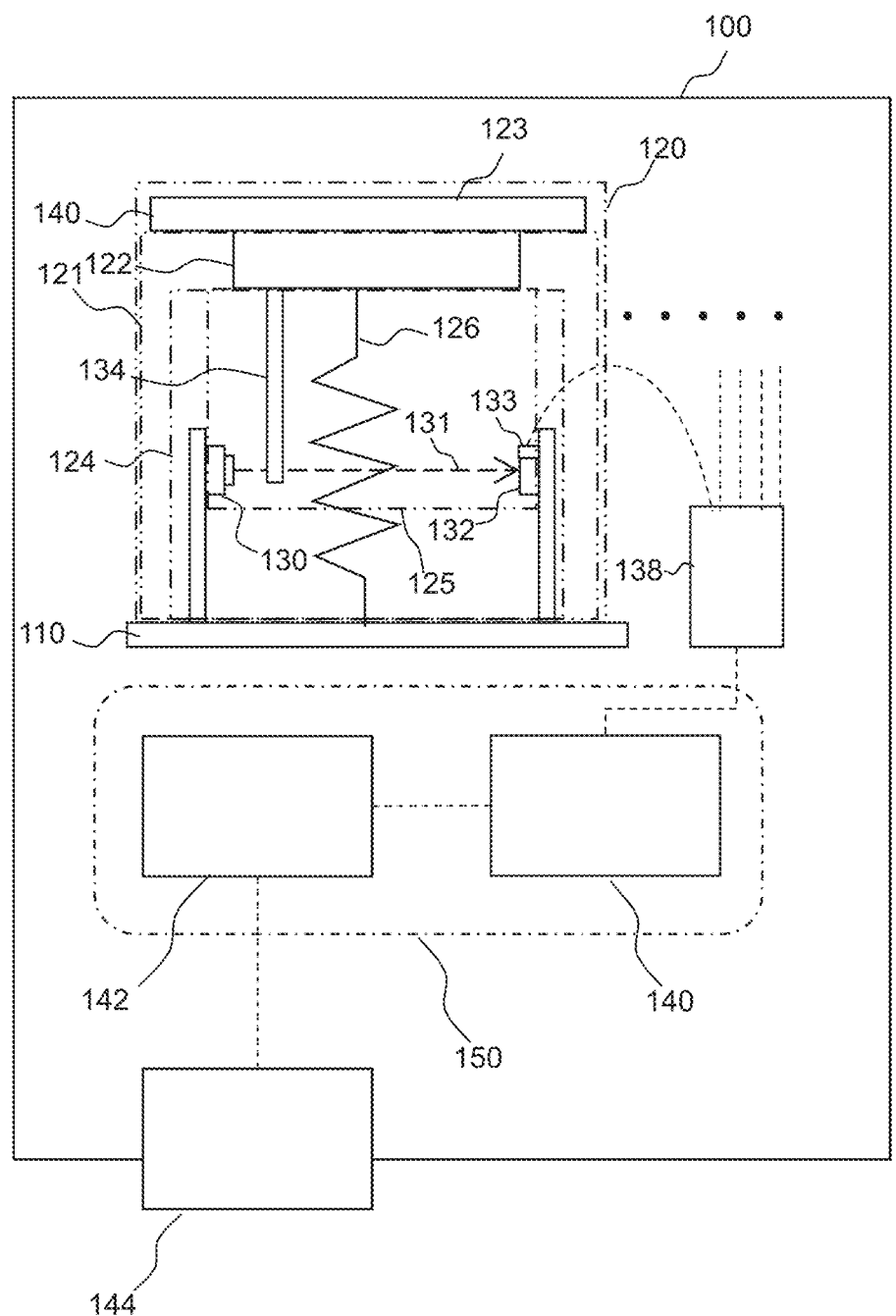
FIG. 1 shows a schematic diagram of an analog input device according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

As described herein, a processor (or a processing unit or a host processing unit or a host processor etc.) may be understood as any kind of a logic implementing entity, which may be special purpose circuitry or a processor executing software stored in a memory, firmware, or any combination thereof. Thus, the processor may be a hard-wired logic circuit or a programmable logic circuit such as a programmable processor (e.g. Programmable Logic Controller (PLC)), e.g. a microprocessor (e.g. a Complex Instruction Set Computer (CISC) processor or a Reduced Instruction Set Computer (RISC) processor). The processor may also be a processor executing software, e.g. any kind of computer program, e.g. a computer program using a virtual machine code such as e.g. Java.

Various embodiments generally relate to an analog input device. In particular, various embodiments generally relate to a force-sensitive analog input device or a pressure-sensitive analog input device. According to various embodiments, the input device may include, but not limited to, a controller, a keypad, a keyboard, a mouse, a joystick, or a steering wheel. According to various embodiments, the input device may include a matrix of analog buttons or keys, each may be configured to vary an input signal based on an amount of depressing force or pressure applied by an user on the respective analog button or key. Accordingly, the respective analog button or key may provide a variable force-sensitive or pressure-sensitive analog input depending on the force or pressure applied to the analog button or key. According to various embodiments, varying an amount of depressing force or pressure applied on the respective analog button or key may vary an extent or degree of depression experienced by the analog button or key. Accordingly, varying the extent or degree of depression of the respective analog button or key may vary an analog output signal of the respective analog button or key from the analog input device. According to various embodiments, the analog output signal may be processed by a processor to generate a corresponding application event in an application.

Various embodiments generally relate to a computing system for receiving and processing analog input and a method of processing analog input for the computer system. The computing system may refer to an information handling system or a functional system capable of performing substantial computation. The computing system may include a processing unit, random-access memory, disk storage, input and output devices etc. According to various embodiments, the computing system may include a host processor and the analog input device of the various embodiments. According to various embodiments, the user may provide an analog input via the analog input device such that an analog input signal may be sent via the analog input device to the host processor and the host processor may process the analog input signal to generate a corresponding application event in response to the analogy input signal and provide a corresponding output. The corresponding output may include, but not limited to, a text and/or graphic display, sound, lightings, or haptic feedback.

The following examples pertain to various embodiments.

Example 1 is an analog input device including:
at least one mounting panel;
a matrix of analog push button assemblies mounted to the at least one mounting panel, each analog push button assembly including an analog pressure sensor, wherein the analog pressure sensor includes
   a pressure reception arrangement having an optical sensing sub-arrangement configured to measure an amount of light varied according to a pressure sensed at the pressure reception arrangement and an output terminal for outputting an analog signal corresponding to the amount of light measured, and
   a plunger element configured to exert the pressure on the pressure reception arrangement when the analog push button assembly is pressed by a user's finger;
a multiplexer including an input side and an output side, wherein the input side is coupled to the output terminals of the matrix of analog push button assemblies,
an analog-to-digital converter which is coupled to the output side of the multiplexer;
a processor which is coupled to the analog-to-digital converter and which is configured to output a data packet including a button identity (ID) of the push button assembly pressed by the user's finger and a digital-step-value corresponding to the analog signal from the push button assembly; and
a communication interface configured to transmit the data packet to a host computing device.

In Example 2, the subject matter of Example 1 may optionally include an analog filter coupled in an electrical connection between the pressure sensor and the analog-to-digital converter.

In Example 3, the subject matter of Example 1 or 2 may optionally include a lighting arrangement including at least one light source controlled by the processor.

In Example 4, the subject matter of any one of Examples 1 to 3 may optionally include that the analog signal is an analog voltage.

In Example 5, the subject matter of any one of Examples 1 to 4 may optionally include that the pressure reception arrangement may include a biasing element which is arranged between the plunger element and the at least one mounting panel and which bias the plunger element away from the at least one mounting panel in a biasing direction.

In Example 6, the subject matter of Example 5 may optionally include that the optical sensing sub-arrangement may include
   a light emitter which is disposed at an intermediate level between the plunger element and the at least one mounting panel and which is oriented to emit light along a light path perpendicular to the biasing direction of the biasing element;

a light sensor which is disposed in the light path and which is configured to generate the analog signal based on the amount of light sensed by the light sensor for outputting via the output terminal, and a light blocking element which is associated with the plunger element in a manner so as to be movable together with the plunger element along a movement direction parallel to the biasing direction and which is extending towards the mounting panel to intersect the light path between the light emitter and the light sensor, wherein the light blocking element includes a cut-out profile which varies the amount of light passing through the light blocking element as the light blocking element moves transversely across the light path when the plunger element is moved towards the at least one mounting panel.

Example 7 is a computing system for receiving and processing analog input, the computing system including a host processor; and the input device according to any one of Examples 1 to 6 connected to the host processor via the communication interface, wherein the host processor is configured to receive the data packet from the input device, to determine an amount of depression of a respective push button assembly based on the digital-step-value corresponding to the analog signal from the push button assembly, and to generate a corresponding predetermined application event in an application based on the determined amount of depression of the respective push button assembly and an input setting for the application.

In Example 8, the subject matter of Example 7 may optionally include that the host processor may be further configured to transform the determined amount of depression onto a non-linear scale prior to generating the corresponding predetermined application event.

In Example 9, the subject matter of Example 7 or 8 may optionally include that the corresponding predetermined application event may include a continuous variable action, and wherein the host processor is configured to generate a state of the continuous variable action according to the determined amount of depression.

In Example 10, the subject matter of Example 7 or 8 may optionally include that the corresponding predetermined application event may include a discrete action, and wherein the host processor is configured to generate the discrete action when the determined amount of depression is equal to or greater than a pre-set depression level.

In Example 11, the subject matter of Example 7 or 8 may optionally include that the corresponding predetermined application event may include a first discrete action and a second discrete action, and wherein the host processor is configured to generate the first discrete action when the determined amount of depression is equal to a first pre-set depression level or between the first pre-set depression level and a second pre-set depression level, and to generate the second discrete action when the determined amount of depression is equal to or greater than the second pre-set depression level.

In Example 12, the subject matter of any one of Examples 7 to 11 may optionally include that the host processor may be configured to toggle between a first input setting and a second input setting for the application based on a user input command via a physical modifier key or a virtual modifier key, and wherein a first corresponding predetermined application event associated with the first input setting is different from a second corresponding predetermined application event associated with the second input setting.

Example 13 is a method of processing analog input for a computing system according to claim 7, the method including:

generating, via the pressure reception arrangement, the analog signal corresponding to the amount of light measured as a measure of the pressure exerted on the pressure reception arrangement when the push button assembly is pressed by a user's finger;

digitizing, via the analog-to-digital converter, the analog signal into the corresponding digital-step-value;

outputting, via the processor, the data packet including button identity (ID) of the push button assembly pressed by the user's finger and a digital-step-value corresponding to the analog signal from the push button assembly;

transmitting, via the communication interface, the data packet from the processor of the input device to the host processor of the computing system;

determining, via the host processor, the amount of depression of the respective push button assembly based on the corresponding digital-step-value from the data packet received; and generating, via the host processor, the corresponding predetermined application event in the application based on the determined amount of depression of the respective push button assembly and the input setting for the application.

In Example 14, the subject matter of Example 13 may optionally include transforming the determined amount of depression onto a non-linear scale prior to generating the corresponding predetermined application event.

In Example 15, the subject matter of Example 13 or 14 may optionally include that the corresponding predetermined application event may include a continuous variable action, and wherein generating the corresponding predetermined event may include generating a state of the continuous variable action according to the determined amount of depression.

In Example 16, the subject matter of Example 13 or 14 may optionally include that the corresponding predetermined application event may include a discrete action, and wherein generating the corresponding predetermined event may include generating the discrete action when the determined amount of depression is equal to or greater than a pre-set depression level.

In Example 17, the subject matter of Example 13 or 14 may optionally include that the corresponding predetermined application event may include a first discrete action and a second discrete action, and wherein generating the corresponding predetermined event may include generating the first discrete action when the determined amount of depression is equal to a first pre-set depression level or between the first pre-set depression level and a second pre-set depression level, and to generate the second discrete action when the determined amount of depression is equal to or greater than the second pre-set depression level.

In Example 18, the subject matter of any one of Examples 13 to 17 may optionally include toggling between a first input setting and a second input setting for the application based on a user input command via a physical modifier key or a virtual modifier key, and wherein a first corresponding predetermined application event associated with the first input setting is different from a second corresponding predetermined application event associated with the second input setting.

FIG. 1 shows a schematic diagram of an analog input device 100 according to various embodiments. According to various embodiments, the analog input device 100 may include at least one mounting panel 110. According to various embodiments, the at least one mounting panel 110 may be part of an internal support structure of the analog input device 100. According to various embodiments, the at least one mounting panel 110 may also be an internal printed circuit board (PCB) of the analog input device 100. According to various embodiments, the analog input device 100 may include a matrix of analog push button assemblies 120 mounted to the at least one mounting panel 110. According to various embodiments, the analog input device 100 may include two or more or a plurality of analog input button assemblies 120. For example, when the analog input device 100 is a mouse, the analogy input device 100 may include two or more analog click buttons. When the analog input device 100 is a keypad having 15-25 keys, the analog input device 100 may include up to 15-25 analog keys. When the analog input device 100 is a gaming controller having four or more buttons, the analog input device 100 may include two or three or four or more analog buttons. When the analog input device 100 is a keyboard, the analog input device 100 may include a plurality of analog keys.

According to various embodiments, each analog push button assembly 120 may include a pressure sensor 121 having a plunger element 122 and a pressure reception arrangement 124. The plunger element 122 may interact with the pressure reception arrangement 124 in a manner so as to exert a pressure or a force on the pressure reception arrangement 124 when the analog push button assembly 120 is being pressed by a user's finger. According to various embodiments, the pressure sensor 121 may be a swappable single unitary key-switch or may be a non-separable integrated built-in arrangement of the analog input device 100. According to various embodiments, each analog push button assembly 120 may include a button cap 123 removably coupled or fixedly coupled to the plunger element 122 of the pressure sensor 121. According to various embodiments, the button cap 123 may be a thin shell having an input surface for receiving a finger tip of the user. Accordingly, the button cap 123 may be ergonomically shaped for receiving the finger tip.

According to various embodiments, the pressure reception arrangement 124 of each analog push button assembly 120 may include an optical sensing sub-arrangement 125 configured to measure an amount of light varied according to a pressure or force sensed at the pressure reception arrangement 124. Accordingly, depressing the push button assembly 120 may exert a corresponding pressure or force on the pressure reception arrangement 124 which may vary the amount of light sensed by the optical sensing sub-arrangement 125. According to various embodiments, the amount of light may be varied via proportionally varying an extent of blockage of the light with a light blocking element 134 with respect to the pressure or force on the pressure reception arrangement 124. According to various embodiments, the pressure reception arrangement 124 may include an output terminal 133 for outputting an analog signal corresponding to the amount of light measured. Accordingly, the amount of light measured may be output as the analog signal. According to various embodiments, the amount of light may be an intensity of light.

According to various embodiments, the pressure reception arrangement 124 may include a biasing element 126. The biasing element 126 may be arranged between the plunger element 122 and the at least one mounting panel 110. The biasing element 126 may bias the plunger element 122 away from the at least one mounting panel 110 in a biasing direction. Accordingly, the biasing element 126 may provide resistance against the pressure or force depressing the analog push button assembly 120. According to various embodiments, the biasing element 126 may include a spring or a resilient membrane structure or other suitable elements, structures or configurations which may return the plunger element 122 to an original or initial position after being depressed. According to various embodiments, the biasing element 126 may be directly or indirectly connected in between the plunger element 122 and the at least one mounting panel 110. According to various embodiments, the pressure reception arrangement 124 may include a housing mounted to the at least one mounting panel 110 and the plunger element 122 may be slidable through a ceiling of the housing. The button cap 123 may be coupled to the plunger element 122 so as to be movable relative to the housing. The biasing element 126 may bias the plunger element 122 away from the floor of the housing in the biasing direction so as to indirectly bias the button cap 123 away from the at least one mounting panel 110.

According to various embodiments, the optical sensing sub-arrangement 125 of the pressure reception arrangement 124 may include a light emitter 130. The light emitter 130 may be disposed at an intermediate level between the plunger element 122 and the at least one mounting panel 110. The light emitter 130 may be oriented to emit light along a light path 131 perpendicular to the biasing direction of the biasing element 126. Accordingly, the light path 131 of the light emitted from the light emitter 130 may be substantially perpendicular to a direction of depression of the at least one analog input button assembly 120 by the user. According to various embodiments, the light emitter 130 may be a laser light emitter or a collimated light emitter. According to various embodiments, the intermediate level between the plunger element 122 and the at least one mounting panel 110 may be a position along a height between the mounting panel 110 and a maximum depression of the plunger element 122.

According to various embodiments, the optical sensing sub-arrangement 125 of the pressure reception arrangement 124 may include a light sensor 132. The light sensor 132 may be disposed in the light path 131 and may be configured to output an analog signal based on the amount of light sensed by the light sensor 132 for outputting via the output terminal 133. Accordingly, the light sensor 132 may be placed in a position that is directly facing the light emitter 130. Hence, the light emitter 130 and the light sensor 132 may be arranged in an opposing manner such that the light from the light emitter 130 is directly projected straight towards the light sensor 132. According to various embodiments, the light sensor 132 may detect an intensity of light incident on the light sensor 132 and output an analog signal according to the intensity of light detected. According to various embodiments, the light sensor 132 may include, but not limited to, a phototransistor-type light sensor or a photoresistor-type light sensor or a photodiode-type light sensor. According to various embodiments, the analog signal from the light sensor 132 may be an analog voltage or an analogue current.

According to various embodiments, the optical sensing sub-arrangement 125 of the pressure reception arrangement 124 may include a light blocking element 134. The light blocking element 134 may be associated with the plunger element 122 in a manner so as to be movable together with the plunger element 122 along a movement direction parallel to the biasing direction. The light blocking element 134 may be extending towards the mounting panel 110 to intersect the light path 131 between the light emitter 130 and the light sensor 132. According to various embodiments, the light blocking element 134 may be directly or indirectly coupled to the plunger element 122. According to various embodiments, the light blocking element 134 may be of an elongate shape and may be extending downwards towards the mounting panel 110. According to various embodiments, the light blocking element 134 may be positioned in a manner such that a movement path of the light blocking element 134, due to depressing of the analog push button assembly 120 by the user, may intersect the light path 131 between the light emitter 130 and the light sensor 132. According to various embodiments, when the pressure reception arrangement 124 includes the housing and the plunger element 122 is slidable through the ceiling of the housing with the button cap 123 coupled to the plunger element 122, the light blocking element 134 may be coupled to the plunger element 122 so as to be movable together with the button cap 123.

According to various embodiments, the light blocking element 134 may include a cut-out profile. FIG. 3A to FIG. 3D show various examples of the cut-out profile 136 of the light blocking element 134. The cut-out profile 136 of the light blocking element 134 may vary the amount of light passing through the light blocking element 134 as the light blocking element 134 moves transversely across the light path 131 when a pressure or force is applied to push the button cap 123 towards the at least one mounting panel 110. Accordingly, the cut-out profile 136 of the light blocking element 134 may vary the extent of blockage of the light path 131 according to the movement of the plunger element 122 as a result of the pressure or force on the pressure reception arrangement 124. According to various embodiments, the cut-out profile 136 of the light blocking element 134 may include, but not limited to, a triangular shape (see FIG. 3A), or a frusto-conical shape (see FIG. 3B), or a trumpet shape (see FIG. 3C), or arc shape (see FIG. 3D) or any other suitable shape which may vary the amount of light passing through as the light blocking element 134 moves to intersect the light path 131. According to various embodiments, the light blocking element 134 may include an elongate plate with the cut-out profile 136 and may be disposed so as to move longitudinally to intersect the light path 131 as the user applies a pressure or force to push the button cap 123.

According to various embodiments, the analog input device 100 may include a multiplexer 138 having an output side and an input side. According to various embodiments, the input side of the multiplexer 138 may be coupled to the output terminals 133 of the matrix of analog push button assemblies 120. Accordingly, the multiplexer 138 may accept multiple analog signals from the matrix of analog push button assemblies 120 and provides a single output. According to various embodiments, the analog input button assemblies 120 of the analog input device 100 may be coupled to the multiplexer 138 via a matrix connection.

According to various embodiments, the analog input device 100 may include an analog-to-digital converter (ADC) 140. The ADC 140 may be coupled to the output side of the multiplexer 138. Accordingly, the ADC 140 may receive the analog signal from the multiplexer 138 and may be configured to discretize the analog signal into a corresponding digital-step-value. According to various embodiments, the multiplexer 138 may be electrically coupled to the ADC 140 such that the analog signal output from the multiplexer 138 may be sent to the ADC 140 for converting into readable data. According to various embodiments, the ADC 140 may convert the continuous-time and continuous-amplitude analog signal from the multiplexer 138 into a discrete-time and discrete-amplitude digital-step-value. According to various embodiments, the ADC 140 may perform the conversion at a predetermined sampling interval. According to various embodiments, the total number of discrete digital-step-values for the range of analog signal from the light sensor 132 may be based on a resolution of the ADC 140. According to various embodiments, the digital-step-value may be an integer number from 0 to N, whereby N is one less than a power of two. Accordingly, each integer number of the digital-step-value may represent a corresponding magnitude of the analog signal from the light sensor 132.

According to various embodiments, the analog input device 100 may include a processor 142. The processor 142 may be coupled to the ADC 140 in a manner so as to receive the digital-step-value. The processor 142 may be configured to output a data packet including a button identity (ID) of the push button assembly 120 pressed by the user's finger and the digital-step-value corresponding to the analog signal from the push button assembly 120. According to various embodiments, the processor 142 and the ADC 140 may be in digital communication with each other. Accordingly, the digital-step-value converted by the ADC 140 may be digitally communicated to the processor 142 from the ADC 140. According to various embodiments, the processor 142 may receive various information data from the ADC 140 and/or the pressure reception arrangement 124 and/or the pressure sensor 121, and may arrange, compile and/or format the various information data, including button identity (ID) and the digital-step-value, into a string of formatted data for transmission. According to various embodiments, the string of formatted data may be in the form of a USB (Universal Serial Bus) HID (Human Interface Device) Vendor report.

According to various embodiments, the analog input device 100 may include a communication interface 144. The communication interface may be wired or wireless. The communication interface 144 may be connectable to a host computing device. The communication interface 144 may be configured to transmit the data packet from the processor 142 to the host computing device. According to various embodiments, the wired communication interface 144 may include USB connector or multi-pin electrical connectors. According to various embodiments, the wireless communication interface 144 may include infrared (IR) communication interface, radio frequency (RF) communication interface, Bluetooth communication interface, or Wi-Fi communication interface. According to various embodiments, the host computing device may be a computer or a programmable machine or programmable electronic device to which peripherals such as the input device 100 may be connected to and which directs the operation of the peripherals, including drivers for input/output devices connected to the host computing device.

According to various embodiments, the ADC 140 and the processor 142 may be separate elements of the analog input device 100. According to various embodiments, the ADC 140 and the processor 142 may be integrated as a single microcontroller 150.

Figure 2:
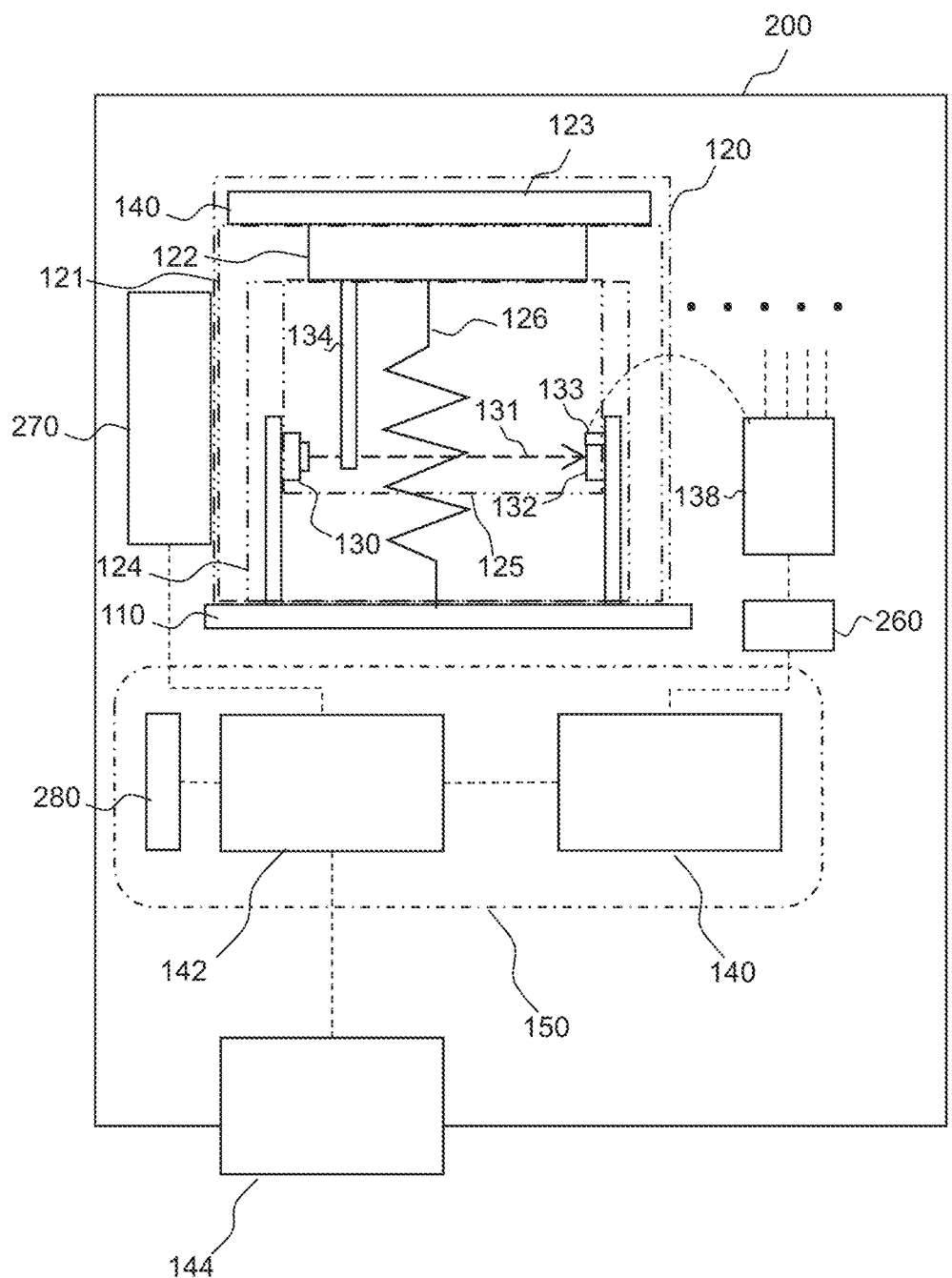
FIG. 2 shows a schematic diagram of an analog input device according to various embodiments.
Figure 3A:
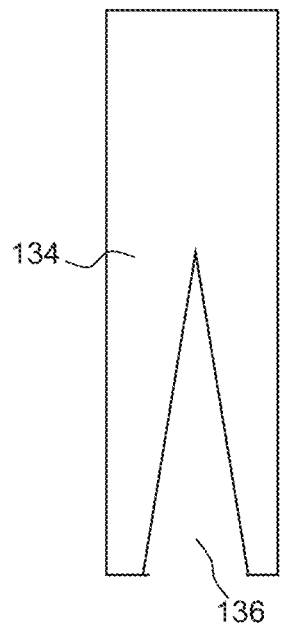
FIG. 3A to FIG. 3D show various examples of the cut-out profile of the light blocking element analog input device of FIG. 1 and FIG. 2 according to various embodiments.
Figure 3B:
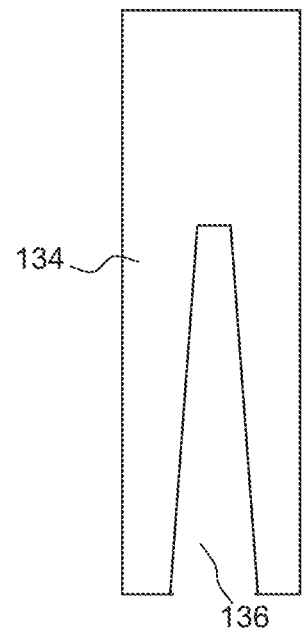
Figure 3C:
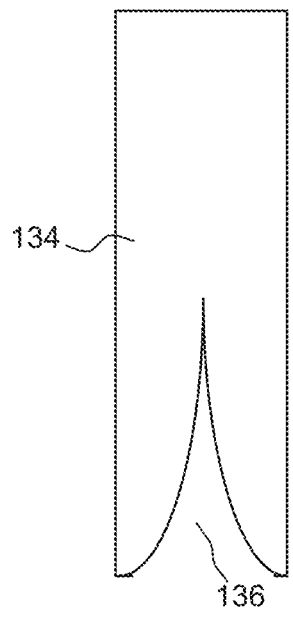
Figure 3D:
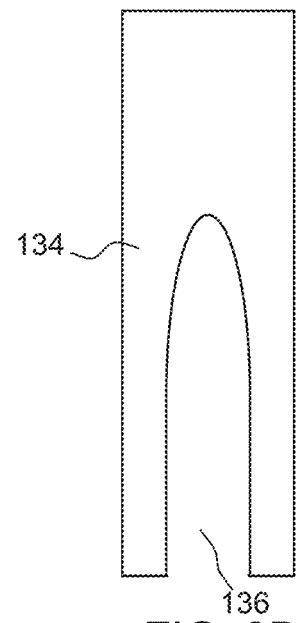

FIG. 2 shows a schematic diagram of an analog input device 200 according to various embodiments. According to various embodiments, the analog input device 200 of FIG. 2 includes all the features of the analog input device 100 of FIG. 1. Accordingly, all features, changes, modifications, and variations that are applicable to the analog input device 100 of FIG. 1 may also be applicable to the analog input device 200 of FIG. 2. According to various embodiments, the analog input device 200 of FIG. 2 may differ from the analog input device 100 of FIG. 1 in that the analog input device 200 of FIG. 2 may further include the following additional features and/or limitations.

According to various embodiments, the analog input device 200 of FIG. 2 may further include a filter 260. The filter 260 may be coupled in an electrical connection between the pressure sensor 121 and the analog-to-digital converter 140. The filter 260 may be configured to reduce noise in the analog signal from the pressure sensor 121. According to various embodiments, the filter 260 may include a low-pass filter.

According to various embodiments, the analog input device 200 of FIG. 2 may further include a storage element 270. The storage element 270 may be coupled to the processor 142 and may store instructions for execution by the processor 142. According to various embodiments, the storage element 270 may be a memory. According to various embodiments, the memory may include, but not limited to, a read-only memory (ROM), an erasable programmable read-only memory (EPROM), or a flash memory.

According to various embodiments, the analog input device 200 of FIG. 2 may further include a lighting arrangement 280 including at least one light source controlled by the processor 142. According to various embodiments, the lighting arrangement 280 may include backlighting for the at least one analog input button assembly 120, and/or underglow lighting for the analog input device 200. According to various embodiments, the processor 142 may be configured to control the lighting arrangement 280 based on a lighting sequence and/or pattern stored in the storage element 270. According to various embodiments, the processor 142 may receive instructions from the host computing device which the analog input device 200 is connected to. According to various embodiments, the processor 142 may prioritise the control of the lighting arrangement 280 to be based on the instructions received from the host computing device over the lighting sequence and/or pattern stored in the storage element 270. According to various embodiments, the processor 142 may overwrite or replace the lighting sequence and/or pattern stored in the storage element 270 with a new lighting sequence and/or pattern based on instructions received from the host computing device.

Figure 4:
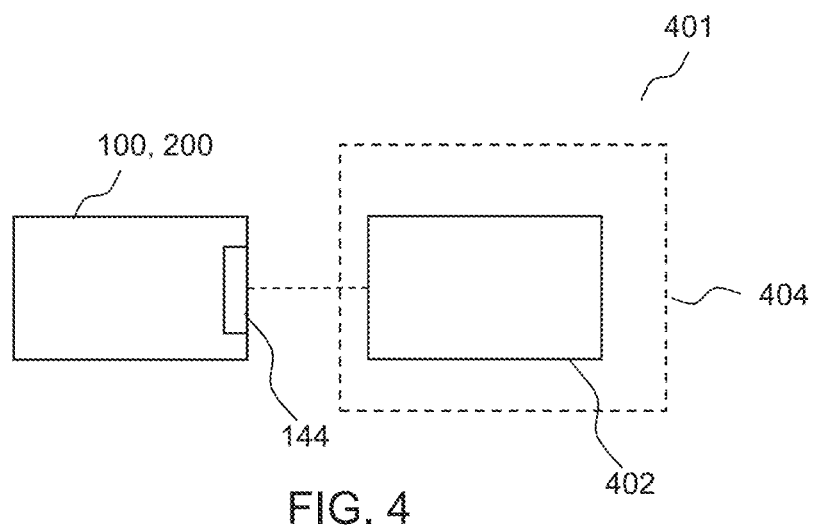
FIG. 4 shows a schematic diagram of a computing system 401 for receiving and processing analog input according to various embodiments.

FIG. 4 shows a schematic diagram of a computing system 401 for receiving and processing analog input according to various embodiments. According to various embodiments, the computing system 401 may include a host processor 402 and the analog input device 100, 200 (of FIG. 1 and/or FIG. 2) connected to the host processor 402 via the communication interface 144. According to various embodiments, the host processor 402 may be a central processing unit of the host computing device 404. According to various embodiments, the host processor 402 may receive the data packet from the input device 100, 200. According to various embodiments, the host processor 402 may interpret the input data packet from the input device 100, 200 and execute programed instructions based on the interpreted input data packet. According to various embodiments, the host processor 402 may determine an amount of depression of the button cap 123 of a respective push button assembly 120 based on the digital-step-value corresponding to the analog signal from the push button assembly 120. According to various embodiments, the host processor 402 may determine an amount of depression of the button cap 123 of the respective push button assembly 120 via performing calculation or mathematical processing or mapping or table loop-up operation or other suitable processing technique. According to various embodiments, the host processor 402 may generate a corresponding predetermined application event in an application program based on the determined amount of depression of the button cap 123 of the respective push button assembly 120 and an input setting for the application program. According to various embodiments, the corresponding predetermined application event may be a programmed action or occurrence triggered by the application program in response or recognition of the determined amount of depression of the button cap 123 of the respective push button assembly 120. According to various embodiments, the input setting for the application program may be a mapping of predetermined application events to the matrix of analog push button assemblies 120 and respective amount of depression. According to various embodiments, the input setting may be a pre-defined setting in the application program. According to various embodiments, the input setting may be a user definable or configurable setting which the user may alter or change in the application program accordingly based on user preference and usage.

According to various embodiments, the host processor 402 may be further configured to transform the determined amount of depression of the button cap 123 of the respective push button assembly 120 onto a non-linear scale prior to generating the corresponding predetermined application event. According to various embodiments, the non-linear scale may include a logarithmic scale or a variable scale. According to various embodiments, with the translation of the determined amount of depression of the button cap 123 of the respective push button assembly 120 onto the non-linear scale, the analog input device 100 may be configured to be more responsive in the lower or middle or higher depression range. According to various embodiments, translation to non-linear scale may allow the user to customise their own setting to suit their personal usage based on desired responsiveness of the analog input device 100.

According to various embodiments, the corresponding predetermined application event may include a continuous variable action. For example, in gaming, the continuous variable action may include a magnitude for a character's speed, directions, movements, actions etc, According to various embodiments, the host processor may be configured to generate a state of the continuous variable action according to the determined amount of depression of the button cap 123 of the respective push button assembly 120.

According to various embodiments, the corresponding predetermined application event may include a discrete action. For example, the discrete action may be a binary action such as on or off. According to various embodiments, the host processor may be configured to generate the discrete action when the determined amount of depression of the respective push button assembly 120 is equal to or greater than a pre-set depression level of the respective push button assembly 120. Accordingly, the input device may serve as a normal binary input device such as a type-writing keyboard or a numeral keypad etc. According to various embodiments, with the pre-set depression level of the button cap 123 of the respective push button assembly 120, an actuation point or trigger point of the respect push button assembly 120 may be configured or programmed. Accordingly, the respective push button assembly 120 may be configured or programmed to generate the discrete action at a desired amount of depression. Thus, the respective push button assembly 120 may trigger the discrete action without requiring full depression of the button cap 123 of the push button assembly 120.

According to various embodiments, the pre-set depression level of the button cap 123 of the respective push button assembly 120 may be a user defined input. Accordingly, the host processor 402 may be configured to receive and store the user defined input as the pre-set depression level of the button cap 123 of the respective push button assembly 120.

According to various embodiments, the corresponding predetermined application event may include a first discrete action and a second discrete action. According to various embodiments, the host processor may be configured to generate the first discrete action when the determined amount of depression of the button cap 123 of the respective push button assembly 120 is equal to a first pre-set depression level of the button cap 123 of the respective push button assembly 120 or between the first pre-set depression level of the button cap 123 of the respective push button assembly 120 and a second pre-set depression level of the button cap 123 of the respective push button assembly 120. According to various embodiments, the host processor may be configured to generate the second discrete action when the determined amount of depression of the button cap 123 of the respective push button assembly 120 is equal to or greater than the second pre-set depression level of the button cap 123 of the respective push button assembly 120. Accordingly, a single push button assembly 120 may be configured to trigger to two or more different discrete actions by pre-setting the two or more different depression ranges for triggering the respective discrete actions. According to various embodiments, each of the first and second pre-set depression levels of the button cap 123 of the respective push button assembly 120 may be a respective user defined input. Accordingly, the host processor 402 may be configured to receive and store the user defined inputs as the first and second pre-set depression levels of the button cap 123 of the respective push button assembly 120.

According to various embodiments, the host processor may be configured to toggle between a first input setting and a second input setting for the application based on a user input command via a physical modifier key or a virtual modifier key. According to various embodiments, a first corresponding predetermined application event associated with the first input setting may be different from a second corresponding predetermined application event associated with the second input setting. For example, in gaming, the first input setting may be a first mapping of fighting related predetermined application events to the matrix of analog push button assemblies 120 and the second input setting may be a second mapping of driving related predetermined application events to the matrix of analog push button assemblies 120.

In the following, a gaming keypad is described as an example of the analog input device 100 according to the various embodiments.

A gaming keypad combines the benefits of keyboards with the compact and ergonomic size of a controller. Typical gaming keypads contain 15-25 keys designed to be controlled by fingers of the users. These keys are laid out in a way similar to that of a keyboard's number pad, to realize various functions such as directions and navigations (up, down, left, and right), changing a weapon, jumping, or shooting. However, the keys in the conventional keypad are coupled to digital switches, which only output a binary signal, limiting the achievable functions of the keypad and possible user intents.

Example embodiments solve these problems by employing analog switches that output analog signals and a corresponding algorithm that process the signals sent from individual keys of the keypad at the host computer that is connected with the keypad wirelessly or through a USB. Analog keypads provide an enhanced input method with more granularity which gives mechanical keyboards the precision control normally found in devices such as gaming controllers, steering wheels, and aviation joysticks. By processing the signals from each key at the host computer, the latency is reduced, and a quicker response is achieved. Further, upgrading the processing solution by handling it in software offers the user flexibility in key mapping.

Figure 5:
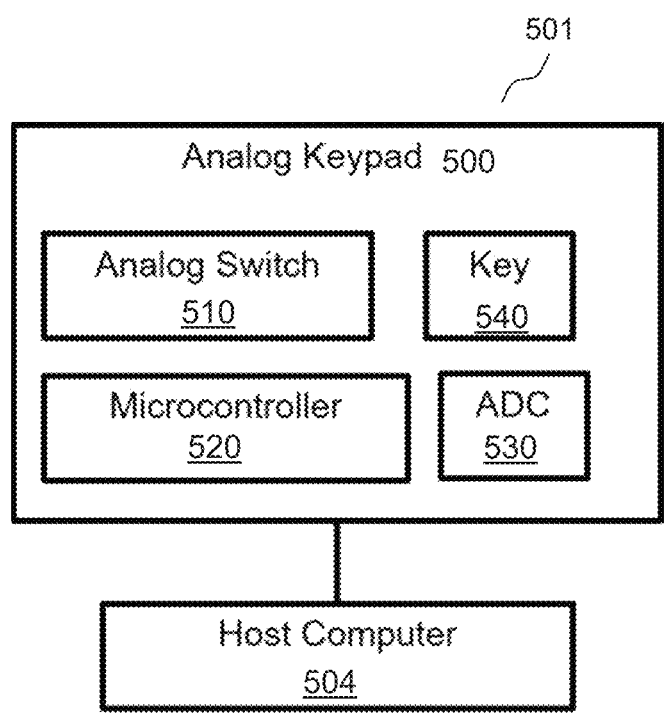
FIG. 5 shows a schematic diagram of a computing system with an analog keypad, as an analog input device, in accordance with an example embodiment.

FIG. 5 shows a computing system 501 having an analog keypad 500, as an analog input device, in accordance with an example embodiment.

By way of example, the analog keypad 500 may include a plurality of analog switches 510 (or analog pressure sensor) each disposed under a key 540, a microcontroller 520 that includes a processor and a memory, and an analog-to-digital converter (ADC) 530. The analog switches 510 may be based on opto-mechanical switch technology and output different analog signals according to the pressure or force applied to the keys or the displacement of the keys compared with the un-pressed position. The ADC 530 may convert the analog signals into digital signals and send the digital signals to the microcontroller to preprocess the data. The analog keypad 500 may be connected with a host computer 504 wirelessly or through a USB. The host computer may receive the preprocessed data from the microcontroller and perform calculation to determine the pressure or force applied to one or more keys and proceed with actions to be taken.

Firmware may be held in the memory 530 (or storage element) such as ROM, EPROM, or flash memory, in order to provide control for the switches and translate the analog signals sent from each analog switch to the hosting computer, such that the hosting computer may further process the signals or data to realize the corresponding functions.

In one example embodiment, when the user presses a key (or a button assembly) to a specific distance, the firmware may register this event and the event will be read by the microcontroller. Different events may be registered for difference distances the keys are pressed down. This microcontroller may constantly be monitoring the keys on the keypad via scanning, which may occur many times per second. The firmware may register when the key is pressed and to what distance the key is pressed, and rapidly perform the process of translating the keypresses from physical contact into electrical signals and then outputting them to the host computer.

By way of example, one analog switch (or pressure sensor) may reside underneath each key. The analog switch may include a light emitter, a chopper (or a light blocking element) disposed in the light path and a light receiver (or light sensor). The path that the lights travels along may be substantially in parallel to the surface of the keycap (or button cap). The amount of light that may be detected by the light receiver may be affected by the location of the chopper, which may be further determined by how far the key is pressed down as a function of pressure or force applied to the keycap. As the displacement of the key is proportional to the pressure or force applied, and the amount of light passing through the chopper may be related to the displacement of the key, the amount of the light detected by the light receiver may also be related to the pressure or force applied to the key. As such, the amount of light indicates the pressure or force applied on the key. For example, a spring (or a biasing element) under the key may be configured to allow a displacement of the keycap from the top end position to a bottom end position, which is proportional to the pressure or force applied to the key. The light receiver outputs analog data based on the intensity of the light detected and the analog data is further processed by the microcontroller before being sent to the host computer.

In one example embodiment, when two directional keys representing x and y directions, respectively, are pressed down simultaneously, the analog switch underneath the first key may output a first analog signal having a first magnitude, and the analog switch underneath the second key may output a second analog signal having a second magnitude. The ADC converts the first and second magnitudes, which are analog signals, into digital signals based on a calibration set with a predetermined range of numbers with a minimum value and a maximum value, and sends the digital signals to the microcontroller. In one example embodiment, one or more filters filter the analog signals based on the predetermined range of numbers and send the filtered analog signals to the ADC, in order to reduce noise in one or more of the analog signals from the force sensitive keys (or pressure sensitive keys).

The microcontroller may further process the digital signals sent by the ADC and converts the digital signals to codes (or format) that the host computer can understand. For example, when the analog keypad is connected with the host computer through USB, the converted code is a USB code. The conversion is usually done using a lookup table. This table is also where the keyboard layout is defined. The host computer receives the codes of each key from the analog keypad and calculates the addition of the codes, for example, and then determine the directions of the movement. The host computer may further adjust the actuation point of the switches. In addition, the host computer may change the function of the key based on the amount of pressure or force applied on the keycap.

Figure 6:
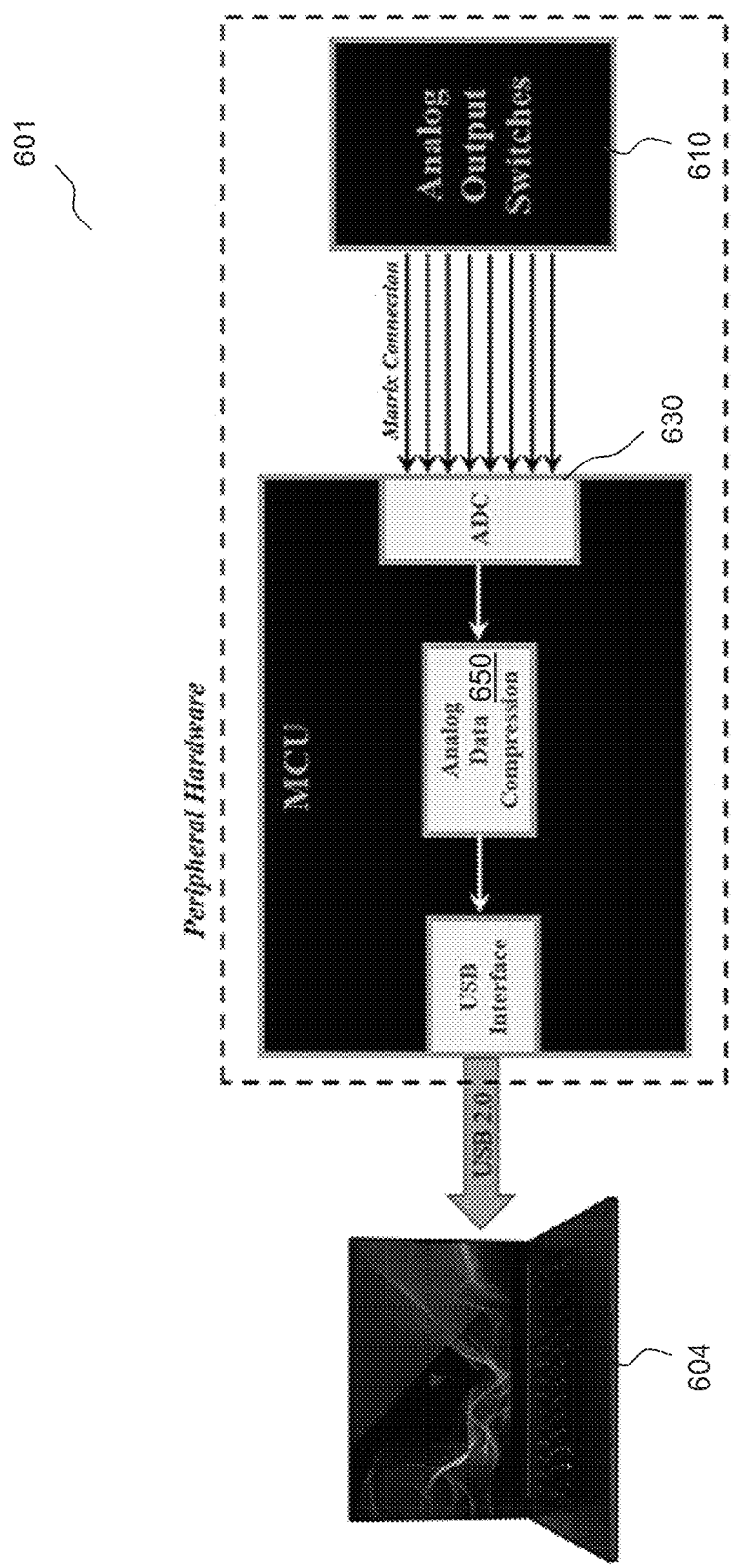
FIG. 6 and FIG. 7 show schematic diagrams of other computing systems with analog input device according to various embodiments.
Figure 7:
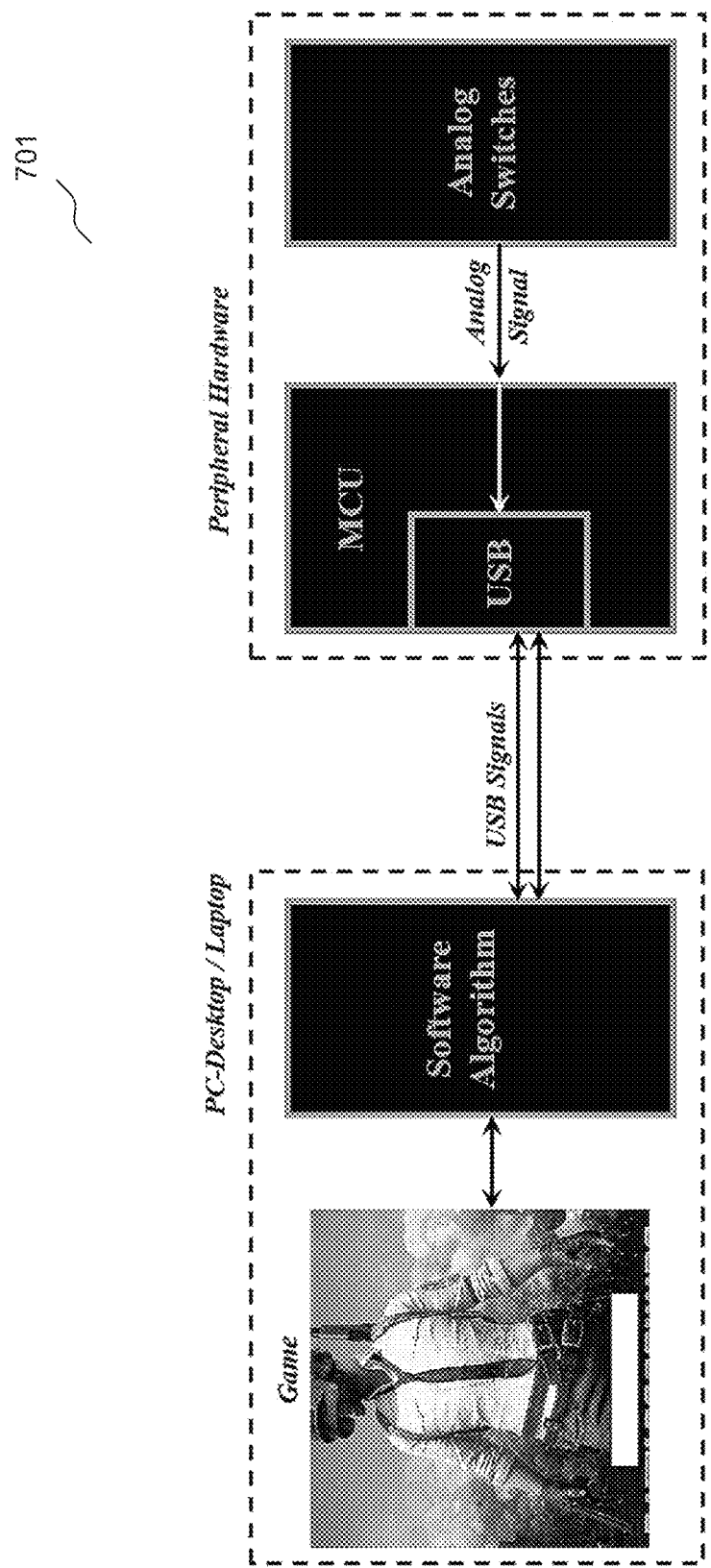

FIG. 6 and FIG. 7 show schematic diagrams of other computing systems 601, 701 with analog input device according to various embodiments. In FIG. 6, 'analog output switches' 610 represent switching hardware that can generate different signal level according to different pressure or force, 'ADC' 630 represents analog-digital-conversion module, a module which converts analog signal to digital data, and 'analog data compression' 650 is the compression of the received data into an encrypted/small packet to send back to the host CPU 604 for analog data translation. According to various embodiments, 'peripheral hardware' will only collect raw analog data, compress it and send back to the host PC through USB-Interface for data-decompression and conversion. All analog conversion for gaming applications may be done in host PC.

The above-mentioned analog keypad 500 is shown as one example embodiment of an input device. Other input devices such as mice, keyboards or controller with analog switches also apply. One or more features of the input device other than computer games may advantageously be incorporated for many other applications in translating user intent to a form interpretable by any type of computing device, including, but not limited to, personal computers, entertainment systems, industrial computing systems, stenography devices, medical computing systems, and other computing devices.

According to various embodiments, there is provided an input device for providing inputs to a computing device. The input device may include at least one input key or button. The at least one input key or button may include an input surface to receive a depressing force or pressure applied by a user. The at least one input key or button may include a switch interaction component to interact with an analog switch. The at least one input key or button may include the analog switch to receive an interaction with the interaction component, whereby the analog switch detects a property that is a function of the amount of depressing force or pressure applied by the user.

According to various embodiments, the input device may be a keyboard having a plurality of input keys, or a keypad having a plurality of input keys, or a mouse having two or more click buttons, or a game controller having a plurality of input keys or buttons.

According to various embodiments, the input surface may be a keycap on the top surface of the key and the switch interaction component may be attached to the bottom surface of the key.

According to various embodiments, the analog switch may be located underneath the key and may interface with the switch interaction component that is attached to the bottom surface of the key.

According to various embodiments, the switch may include a light emitter, light receiver, and a chopper, whereby the light emitter may emit light in a light path substantially in parallel to the surface of the keycap which is received by the light receiver, wherein the chopper may be disposed between the light emitter and light receiver.

According to various embodiments, the interaction component may be configured to interface with the chopper to cause the chopper to move within the light path and affect the amount of light that passes through the chopper and that is received by the light receiver, and wherein the property detected by the analog switch is an amount of light received by the light receiver.

According to various embodiments, the amount of movement of the chopper within the light path may be a function of the amount of depressing force or pressure applied by the user.

Various embodiments have provided an analog input device which may provide more granularity of the input in an effective and simple manner. Various embodiments have also provide an analog input device whereby the data processing will be done by the host computing device while the analog input device will just send analog data. In other words, major data crunching is performed by the host computing device while the analog input device only perform minimum pre-processing of analog signal for sending to the host computing device. Accordingly, manufacturing costs of the analog input device may be significantly reduced and the analog data processing performance may increase. Various embodiments have provided an analog input device which has re-define conventional input device. According to various embodiments, the analog input device may give more option to end user. According to various embodiments, the analog input device of the computing system may provide definable trigger point (or configurable actuation point), more than one trigger point which allows multifunctions with a single key (or multiple actuation point for multiple events with a single key/button), and/or joystick/flight stick/driving wheel/game controller functions mapping.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. An analog input device comprising:
   at least one mounting panel;
   a matrix of analog push button assemblies mounted to the at least one mounting panel, wherein each analog push button assembly outputs an analog signal as a measure of an amount of depression of said analog push button assembly when pressed by a user's finger;
   a multiplexer including an input side and an output side, wherein the input side is coupled to output terminals of the matrix of analog push button assemblies;
   an analog-to-digital converter which is coupled to the output side of the multiplexer, wherein the analog-to-digital converter converts the analog signal from a corresponding push button assembly pressed by the user's finger into a digital-step-value; and
   a processor which is coupled to the analog-to-digital converter and which is configured to output a data packet including a button identity (ID) of the corresponding push button assembly pressed by the user's finger and the digital-step-value converted from the analog signal of the corresponding push button assembly by the analog-to-digital converter, the data packet being for transmitting to a host computing device.

2. The input device as claimed in claim 1, further comprising a communication interface configured to transmit the data packet to the host computing device.

3. The input device as claimed in claim 1, wherein each of the matrix of analog push button assemblies comprises an analog pressure sensor, wherein the analog pressure sensor comprises:
   a pressure reception arrangement having an optical sensing sub-arrangement configured to measure an amount of light varied according to a pressure sensed at the pressure reception arrangement and an output terminal, and
   a plunger element configured to exert the pressure on the pressure reception arrangement, wherein when the analog push button assembly is pressed by the user's finger the amount of depression of the analog push button assembly causes the plunger element of the analog push button assembly to correspondingly exert the pressure on the pressure reception arrangement of the analog push button assembly to vary the amount of light to be detected by the optical sensing sub-arrangement so as to generate the analog signal corresponding to the amount of depression of the analog push button assembly.

4. The input device as claimed in claim 3, further comprising an analog filter coupled in an electrical connection between the pressure sensor and the analog-to-digital converter.

5. The input device as claimed in claim 1, further comprising a lighting arrangement including at least one light source controlled by the processor.

6. The input device as claimed in claim 1, wherein the analog signal is an analog voltage.

7. The input device as claimed in claim 3, wherein the pressure reception arrangement comprises a biasing element which is arranged between the plunger element and the at least one mounting panel and which bias the plunger element away from the at least one mounting panel in a biasing direction.

8. The input device as claimed in claim 7, wherein the optical sensing sub-arrangement comprises:
   a light emitter which is disposed at an intermediate level between the plunger element and the at least one mounting panel and which is oriented to emit light along a light path perpendicular to the biasing direction of the biasing element;
   a light sensor which is disposed in the light path and which is configured to generate the analog signal based on the amount of light sensed by the light sensor for outputting via the output terminal; and
   a light blocking element which is associated with the plunger element in a manner so as to be movable together with the plunger element along a movement direction parallel to the biasing direction and which is extending towards the mounting panel to intersect the light path between the light emitter and the light sensor, wherein the light blocking element comprises a cut-out profile which varies the amount of light passing through the light blocking element as the light blocking element moves transversely across the light path when the plunger element is moved towards the at least one mounting panel.

9. A computing system for receiving and processing analog input, the computing system comprising:
   a host processor; and
   an input device comprising:
   at least one mounting panel;
   a matrix of analog push button assemblies mounted to the at least one mounting panel, wherein each analog push button assembly outputs an analog signal as a measure of an amount of depression of said analog push button assembly when pressed by a user's finger;
   a multiplexer including an input side and an output side, wherein the input side is coupled to output terminals of the matrix of analog push button assemblies;
   an analog-to-digital converter which is coupled to the output side of the multiplexer, wherein the analog-to-digital converter converts the analog signal from a corresponding push button assembly pressed by the user's finger into a digital-step-value;
   a processor which is coupled to the analog-to-digital converter and which is configured to output a data packet including a button identity (ID) of the corresponding push button assembly pressed by the user's finger and the digital-step-value converted from the analog signal of the corresponding push button assembly by the analog-to-digital converter, the data packet being for transmitting to a host computing device; and
   a communication interface configured to transmit the data packet to the host computing device,
   wherein the input device is connected to the host processor via the communication interface,
   wherein the host processor is configured to receive the data packet from the input device, to determine an amount of depression of the corresponding push button assembly based on the digital-step-value of the data packet, and to generate a corresponding predetermined application event in an application based on the determined amount of depression of the corresponding push button assembly and an input setting for the application.

10. The computing system as claimed in claim 9, wherein the host processor is further configured to transform the determined amount of depression of the corresponding push button assembly onto a non-linear scale prior to generating the corresponding predetermined application event.

11. The computing system as claimed in claim 10, wherein the corresponding predetermined application event comprises a continuous variable action, and wherein the host processor is configured to generate a state of the continuous variable action according to the determined amount of depression of the corresponding push button assembly.

12. The computing system as claimed in claim 9, wherein the corresponding predetermined application event comprises a discrete action, and wherein the host processor is configured to generate the discrete action when the determined amount of depression of the corresponding push button assembly is equal to or greater than a pre-set depression level of the corresponding push button assembly.

13. The computing system as claimed in claim 9, wherein the corresponding predetermined application event comprises a first discrete action and a second discrete action, and wherein the host processor is configured to generate the first discrete action when the determined amount of depression of the corresponding push button assembly is equal to a first pre-set depression level of the corresponding push button assembly or between the first pre-set depression level of the corresponding push button assembly and a second pre-set depression level of the corresponding push button assembly, and to generate the second discrete action when the determined amount of depression of the corresponding push button assembly is equal to or greater than the second pre-set depression level of the corresponding push button assembly.

14. The computing system as claimed in claim 9, wherein the host processor is configured to toggle between a first input setting and a second input setting for the application based on a user input command via a physical modifier key or a virtual modifier key, and wherein a first corresponding predetermined application event associated with the first input setting is different from a second corresponding predetermined application event associated with the second input setting.

15. A method of processing analog input for a computing system comprising a host processor and an input device connected to the host processor via a communication interface, wherein the input device comprises:
at least one mounting panel; a matrix of analog push button assemblies mounted to the at least one mounting panel, wherein each analog push button assembly outputs an analog signal as a measure of an amount of depression of said analog push button assembly when pressed by a user's finger;
a multiplexer including an input side and an output side, wherein the input side is coupled to output terminals of the matrix of analog push button assemblies;
an analog-to-digital converter which is coupled to the output side of the multiplexer, wherein the analog-to-digital converter converts the analog signal from a corresponding push button assembly pressed by the user's finger into a digital-step-value;
a processor which is coupled to the analog-to-digital converter and which is configured to output a data packet including a button identity (ID) of the corresponding push button assembly pressed by the user's finger and the digital-step-value converted from the analog signal of the corresponding push button assembly by the analog-to-digital converter, the data packet being for transmitting to a host computing device; and
the communication interface configured to transmit the data packet to the host computing device,
the method comprising:
generating, via a pressure reception arrangement, the analog signal corresponding to the amount of light measured as a measure of the pressure exerted on the pressure reception arrangement when the corresponding push button assembly is pressed by a user's finger;
digitizing, via the analog-to-digital converter, the analog signal into a digital-step-value;
outputting, via the processor, the data packet including button identity (ID) of the corresponding push button assembly pressed by the user's finger and the digital-step-value converted from the analog signal of the corresponding push button assembly by the analog-to-digital converter;
transmitting, via the communication interface, the data packet from the processor of the input device to the host processor of the computing system;
determining, via the host processor, the amount of depression of the corresponding push button assembly based on the digital-step-value from the data packet received; and
generating, via the host processor, a corresponding predetermined application event in the application based on the determined amount of depression of the corresponding push button assembly and an input setting for the application.

16. The method as claimed in claim 15, further comprising transforming the determined amount of depression of the corresponding push button assembly onto a non-linear scale prior to generating the corresponding predetermined application event.

17. The method as claimed in claim 15, wherein the corresponding predetermined application event comprises a continuous variable action, and wherein generating the corresponding predetermined event comprises generating a state of the continuous variable action according to the determined amount of depression of the corresponding push button assembly.

18. The method as claimed in claim 15, wherein the corresponding predetermined application event comprises a discrete action, and wherein generating the corresponding predetermined event comprises generating the discrete action when the determined amount of depression is equal to or greater than a pre-set depression level of the corresponding push button assembly.

19. The method as claimed in claim 15, wherein the corresponding predetermined application event comprises a first discrete action and a second discrete action, and wherein generating the corresponding predetermined event comprises generating the first discrete action when the determined amount of depression is equal to a first pre-set depression level of the corresponding push button assembly or between the first pre-set depression level of the corresponding push button assembly and a second pre-set level, and to generate the second discrete action when the determined amount of depression of the corresponding push button assembly is equal to or greater than the second pre-set depression level of the corresponding push button assembly.

20. The method as claimed in claim 15, further comprising toggling between a first input setting and a second input setting for the application based on a user input command via a physical modifier key or a virtual modifier key, and wherein a first corresponding predetermined application event associated with the first input setting is different from a second corresponding predetermined application event associated with the second input setting.

* * * * *